(12) United States Patent
Lin et al.

(10) Patent No.: US 12,040,215 B2
(45) Date of Patent: Jul. 16, 2024

(54) BONDING MACHINE WITH MOVABLE SUCTION MODULES

(71) Applicant: SKY TECH INC., Hsinchu County (TW)

(72) Inventors: Jing-Cheng Lin, Hsinchu County (TW); Jung-Hua Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 224 days.

(21) Appl. No.: 17/864,191

(22) Filed: Jul. 13, 2022

(65) Prior Publication Data
US 2024/0021462 A1 Jan. 18, 2024

(51) Int. Cl.
*H01L 21/68* (2006.01)
*H01L 21/683* (2006.01)

(52) U.S. Cl.
CPC .......... *H01L 21/6838* (2013.01); *H01L 21/68* (2013.01)

(58) Field of Classification Search
CPC .................................................. H01L 21/6838
See application file for complete search history.

(56) References Cited

FOREIGN PATENT DOCUMENTS

EP 0899778 A2 * 3/1999

* cited by examiner

Primary Examiner — Jeffry H Aftergut
(74) Attorney, Agent, or Firm — Chun-Ming Shih; HDLS IPR SERVICES

(57) ABSTRACT

A bonding machine with movable suction modules includes a first cavity, a second cavity, a pressing unit, a carrier, and a plurality of movable suction modules. The first cavity is configured to be connected to the second cavity to form a closed space therebetween. The pressing unit is arranged in the first cavity, and the carrier is arranged in the second cavity. The pressing unit faces the carrier and is configured to bond a substrate placed on the carrier. The movable suction modules are arranged in a plurality of setting grooves on a bearing surface of the carrier for absorbing and flattening the substrate placed on the bearing surface. The movable suction modules is displaceable along the bearing surface and continuously absorb and flatten a substrate in a process of aligning the substrate, to help improve accuracy of substrate alignment.

20 Claims, 12 Drawing Sheets

BONDING MACHINE WITH MOVABLE SUCTION MODULES

BACKGROUND

Technical Field

This disclosure relates to a bonding machine with movable suction modules. In a process of aligning a substrate, the movable suction modules can continuously absorb and flatten the substrate, to help improve accuracy of substrate alignment.

Related Art

The integrated circuit technology has been mature, and currently, electronic products are developed to be lightweighted, thin, and short, and have high performance, high reliability, and intelligence. A chip in an electronic product has a significant impact on performance of the electronic product. The performance is partly related to a thickness of the chip. For example, a thinner wafer can improve heat dissipation efficiency, enhance mechanical performance and electrical performance, and reduce a volume and weight of a package.

In a semiconductor manufacturing process, generally, a thinning process, a through-hole etching process, and a back metallization process are performed on a back surface (that is, a bottom surface) of a wafer. Generally, a bonding process is performed before the wafer thinning process. Mainly, an adhesive layer is arranged between a wafer and a carrier (such as sapphire glass), and the stacked wafer and carrier are pressed together through a pressing unit and a carrier, thereby completing bonding between the wafer and the carrier. After the wafer thinning process, a de-bonding process is performed to separate the wafer from the carrier.

However, since expansion coefficients of material layers of a wafer are different, the wafer often produces wafer warpage after a high temperature process. In addition, wafers may have different warpage shapes, such as a saddle-like shape and a hill-like shape, which is not conducive to aligning the wafers that are stacked in the subsequent bonding process and easily causes inaccurate alignment.

SUMMARY

To resolve the problems in the related art, this disclosure provides a bonding machine with movable suction modules, which can absorb a substrate with warpage placed on a bearing surface of a carrier by using a plurality of movable suction modules, and flatten the substrate with warpage. In a process of aligning a substrate by an alignment unit, the movable suction module continuously absorbs the substrate and is displaced relative to the bearing surface with the substrate, so that the alignment unit can align a flat substrate, thereby helping improve accuracy of substrate alignment.

An objective of this disclosure is to provide a bonding machine with movable suction modules, including a first cavity, a second cavity, a pressing unit, a carrier, and a plurality of movable suction modules. The first cavity is configured to be connected to the second cavity to form a closed space therebetween.

The movable suction module is arranged on a bearing surface of the carrier, and includes an suction unit and a linear actuator. The linear actuator is configured to drive the suction unit to move up and down relative to the bearing surface. The linear actuator may drive the suction unit to move up and absorb a substrate with warpage. Then, the linear actuator drives the suction unit to move down, to flatten a warpage part of the substrate.

After the suction unit flattens the substrate with warpage, the substrate may be aligned by the alignment unit. In the process of aligning the substrate by the alignment unit, the suction unit can continuously absorb the substrate, so that the substrate does not return to an original warpage state, thereby helping improve the accuracy of the substrate alignment.

An objective of this disclosure is to provide a bonding machine with movable suction modules. A plurality of setting grooves are provided on a bearing surface of the carrier, and the suction unit of the movable suction module is placed in the setting groove. A cross-sectional area of the suction unit is less than a cross-sectional area of the setting groove, which enables the suction unit to displace with the substrate in the setting groove, to continuously absorb and flatten the substrate by the suction unit in the process of aligning the substrate.

To achieve the foregoing objectives, this disclosure provides a bonding machine with movable suction modules, including: a first cavity; a second cavity facing the first cavity, where the first cavity is configured to be connected to the second cavity to form a closed space between the first cavity and the second cavity; a pressing unit connected to the first cavity and located in the closed space; a carrier connected to the second cavity and located in the closed space, where the carrier includes a bearing surface facing the pressing unit, the bearing surface is configured to bear a first substrate, a second substrate is placed on the first substrate, and a plurality of setting grooves are provided on the bearing surface; and a plurality of the movable suction modules, including: a plurality of suction units arranged in the plurality of setting grooves on the bearing surface and being displaceable relative to the bearing surface, where the suction unit is configured to absorb the first substrate placed on the bearing surface; and a plurality of suction unit drivers connected to the plurality of suction units and configured to drive the suction units to move up and down relative to the bearing surface, so that the suction units flatten the absorbed first substrate.

In at least one embodiment, the bonding machine further includes a plurality of distance measurement units arranged on the pressing unit and configured to measure distances from the plurality of distance measurement units to the first substrate placed on the bearing surface.

In at least one embodiment, the suction unit driver is configured to adjust a lifting height of the suction unit according to a measurement result from the distance measurement unit, so that the suction unit absorbs the first substrate.

In at least one embodiment, the movable suction module includes a frame body, where the frame body includes an accommodation space configured to accommodate the suction unit, and the suction unit driver is connected to the frame body and drives, through the frame body, the suction unit to move up and down relative to the bearing surface.

In at least one embodiment, the suction unit includes an adsorption opening and an air extraction pipe line, where the air extraction pipe line is fluidly connected to the adsorption opening to form a negative pressure above the adsorption opening, so that the adsorption opening absorbs the first substrate placed on the bearing surface.

In at least one embodiment, a cross-sectional area of the accommodation space of the frame body is greater than a cross-sectional area of the suction unit, so that the suction unit is displaceable relative to the bearing surface in the accommodation space.

In at least one embodiment, the frame body includes at least one perforation, and a fastener passes through the perforation of the frame body to connect to the suction unit. A cross-sectional area of the perforation is greater than a cross-sectional area of a rod portion of the fastener.

In at least one embodiment, the bonding machine further includes a plurality of elastic units located between the frame body and the suction unit.

In at least one embodiment, the bonding machine further includes a plurality of alignment units located on the bearing surface and configured to align the first substrate and the second substrate, where in the process of aligning the first substrate, the alignment unit drives, through the first substrate, the suction unit to displace relative to the bearing surface in the accommodation space of the frame body.

In at least one embodiment, the bonding machine further includes a plurality of air extraction openings provided on the bearing surface of the carrier and located at inner sides of the plurality of movable suction modules. The movable suction modules are configured to absorb an outer side of the first substrate, and the plurality of air extraction openings are configured to absorb an inner side of the first substrate.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
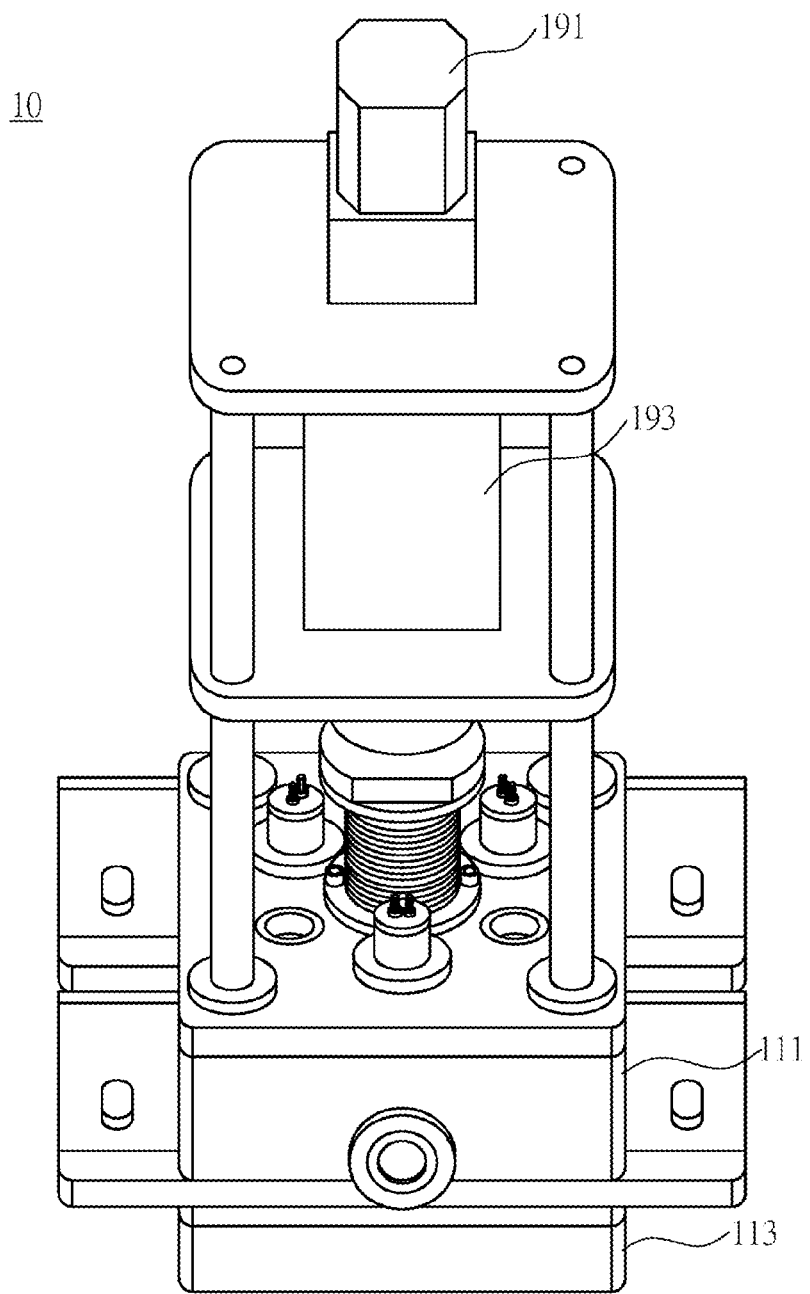
FIG. 1 is a schematic three-dimensional diagram of an embodiment of a bonding machine with movable suction modules according to this disclosure.
Figure 2:
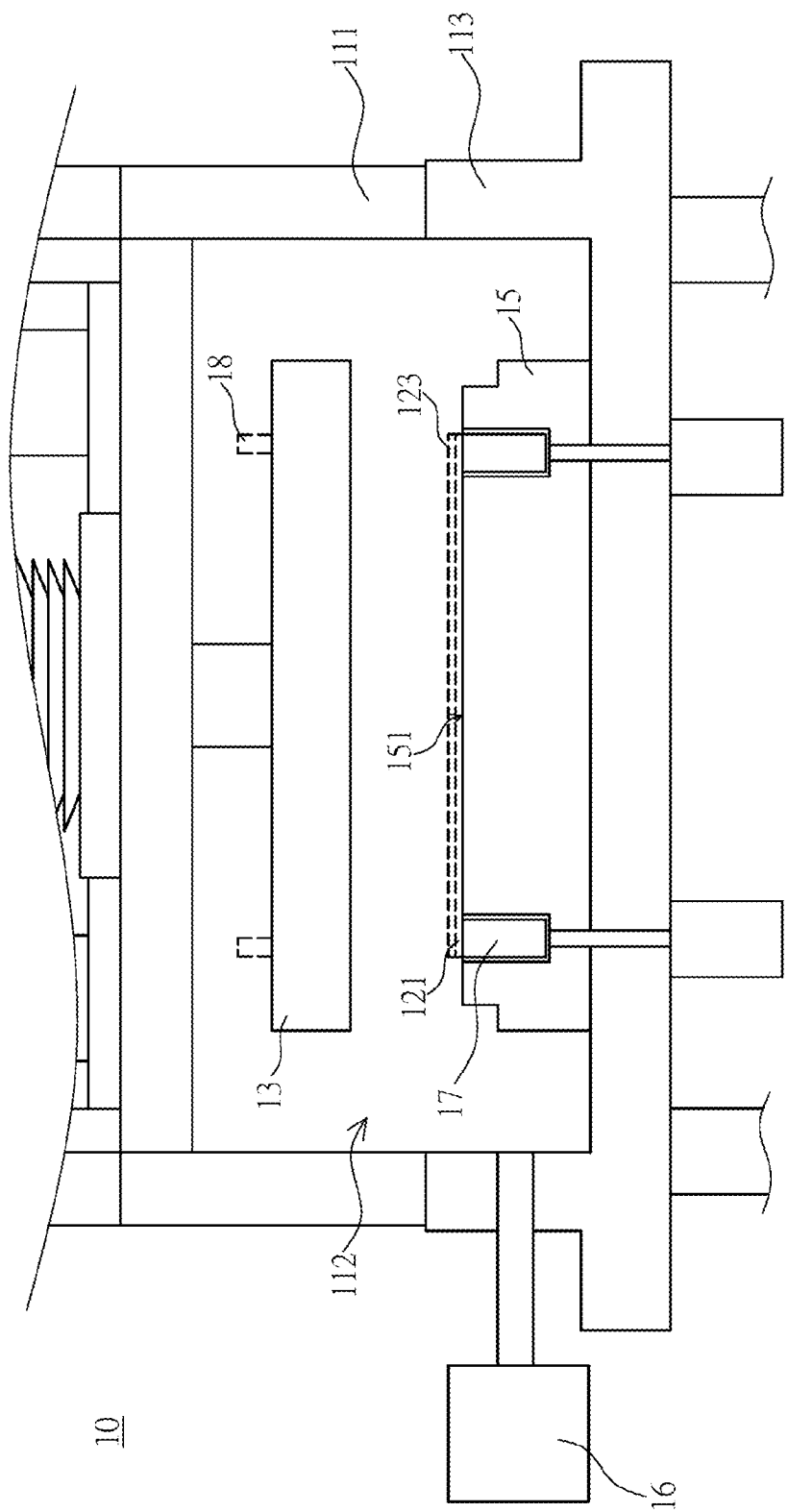
FIG. 2 is a schematic cross-sectional view of an embodiment of a bonding machine with movable suction modules according to this disclosure.

FIG. 1 and FIG. 2 are a schematic three-dimensional diagram and a schematic cross-sectional view of a bonding machine with movable suction modules according to this disclosure. As shown in the figures, a bonding machine 10 with movable suction modules includes a first cavity 111, a second cavity 113, a pressing unit 13, a carrier 15, and a plurality of movable suction modules 17. The first cavity 111 faces the second cavity 113, and the first cavity 111 is displaceable relative to the second cavity 113.

As shown in FIG. 2, the pressing unit 13 is located in the first cavity 111 and connected to the first cavity 111. The carrier 15 is located in the second cavity 113 and connected to the second cavity 113. A bearing surface 151 of the carrier 15 faces the pressing unit 13. After the first cavity 111 is connected to the second cavity 113, a closed space 112 is formed therebetween, and the pressing unit 13 and the carrier 15 are located in the closed space 112. The bearing surface 151 is configured to bear a first substrate 121, and a second substrate 123 may be placed on the first substrate 121.

As shown in FIG. 1, the first cavity 111 may be connected to a cavity driver 191. The cavity driver 191 is located outside the closed space 112 and connected to the first cavity 111. The cavity driver 191 is configured to drive the first cavity 111 to displace relative to the second cavity 113. For example, the cavity driver 191 may be a linear actuator.

In addition, a pressing unit driver 193 is located outside the closed space 112 and connected to the pressing unit 13. For example, the pressing unit driver 193 may be a linear actuator for driving the pressing unit 13 to approach or move away from the carrier 15. After alignment of the first substrate 121 and the second substrate 123, the pressing unit driver 193 may drive the pressing unit 13 to approach the bearing surface 151 and press the first substrate 121 and the second substrate 123 carried by the carrier 15, to implement bonding between the first substrate 121 and the second substrate 123.

As shown in FIG. 2, the first cavity 111 or the second cavity 113 may be provided with an air extraction motor 16. The air extraction motor 16 is fluidly connected to the closed space 112 for extracting air inside the closed space 112, so that a pressure inside the closed space 112 is lowered, and thus the closed space 112 is maintained in a vacuum or low pressure state.

The bearing surface 151 is configured to bear the first substrate 121 and the second substrate 123 that are stacked. For example, the first substrate 121 is a bearing substrate, and the second substrate 123 is a wafer. An adhesive layer is provided between the first substrate 121 and the second substrate 123 for adhering the first substrate 121 to the second substrate 123. In different embodiments, the first substrate 121 and the second substrate 123 may also be wafers on which a semiconductor manufacturing process has been performed.

Figure 3:
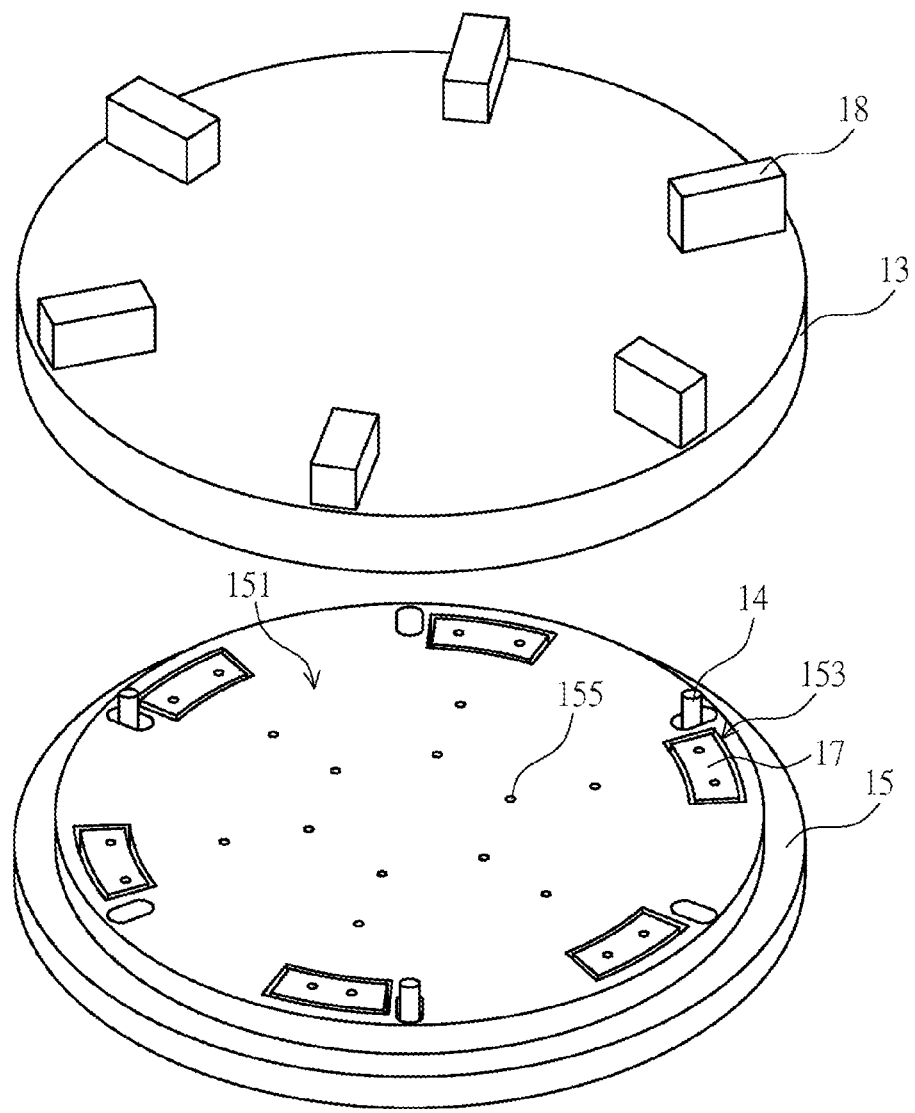
FIG. 3 is a schematic three-dimensional diagram of an embodiment of a pressing unit and a carrier of a bonding machine with movable suction modules according to this disclosure.
Figure 4:
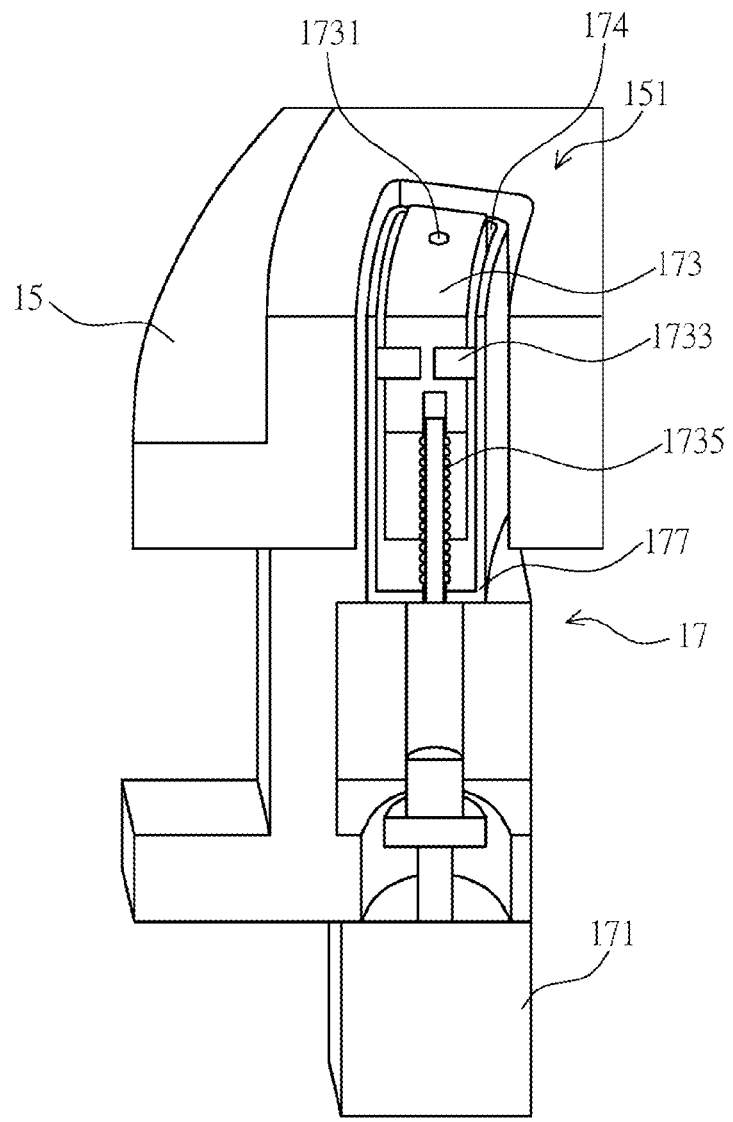
FIG. 4 is a schematic three-dimensional cross-sectional view of an embodiment of a movable suction module according to this disclosure.

As shown in FIG. 3 and FIG. 4, the movable suction module 17 is located in the second cavity 113 and arranged on the carrier 15. The movable suction module 17 includes an suction unit driver 171 and an suction unit 173. The suction unit driver 171 is connected to the suction unit 173, and the suction unit 173 is configured to absorb the first substrate 121 placed on the bearing surface 151. For example, the suction unit driver 171 may be a linear actuator, and is connected to the suction unit 173 and drives the suction unit 173 to move up and down relative to the bearing surface 151.

A plurality of setting grooves 153 may be provided on the bearing surface 151, and the movable suction module 17 is arranged in each setting groove 153. For example, the suction unit 173 is located in the setting groove 153. The suction unit driver 171 may drive the suction unit 173 to move up and down relative to the bearing surface of the carrier 15 in the setting groove 153.

As shown in FIG. 4, the movable suction module 17 may include a frame body 177, and the suction unit driver 171 is connected to the frame body 177 and drives the frame body 177 and/or the suction unit 173 to move up and down relative to the bearing surface 151.

Figure 5:
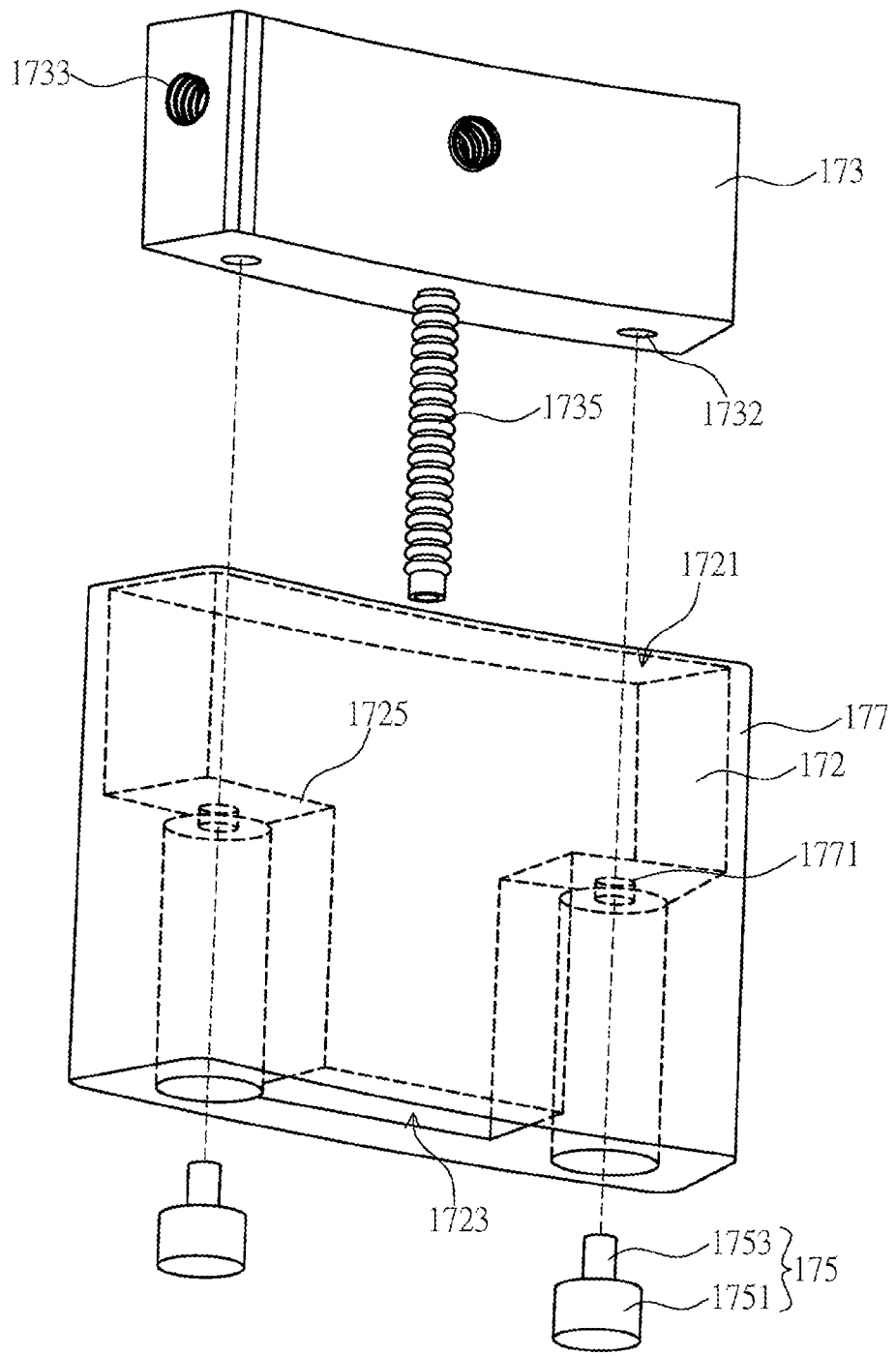
FIG. 5 is a schematic three-dimensional exploded view of an embodiment of an suction unit and a frame body of a bonding machine with movable suction modules according to this disclosure.
Figure 6:
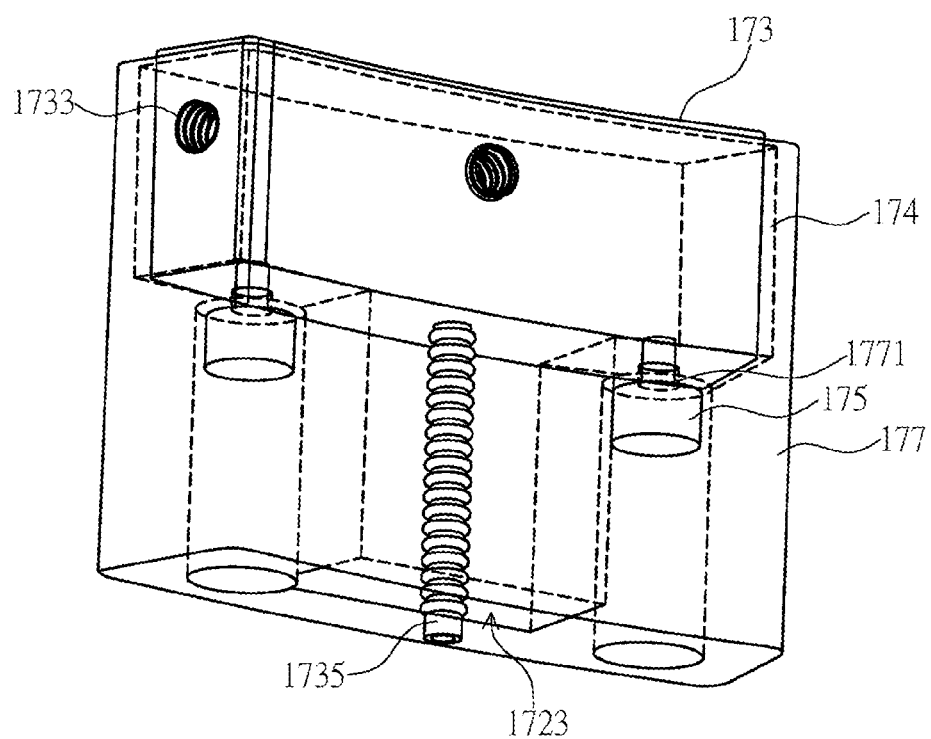
FIG. 6 is a three-dimensional perspective diagram of an embodiment of an suction unit and a frame body of a bonding machine with movable suction modules according to this disclosure.

As shown in FIG. 5 and FIG. 6, the frame body 177 includes an accommodation space 172 for accommodating the suction unit 173. Some of the suction units 173 may protrude from the frame body 177. The suction unit driver 171 is connected to the frame body 177, and is connected to the suction unit 173 through the frame body 177 to drive the suction unit 173 to move up and down relative to the bearing surface 151.

The frame body 177 may be provided with at least one perforation 1771, and a fastener 175 may pass through the perforation 1771 of the frame body 177 to connect to a fixing hole 1732 at the bottom of the suction unit 173. For example, the fastener 175 may be a screw, and the fixing hole 1732 may be a screw hole.

The accommodation space 172 may include at least one connection bottom surface 1725, and the perforation 1771 is provided on the connection bottom surface 1725. The connection bottom surface 1725 may be configured to bear the suction unit 173, and the fastener 175 passes through the perforation 1771 of the connection bottom surface 1725 to connect to the suction unit 173.

Specifically, a horizontal cross-sectional area of the suction unit 173 may be less than a horizontal cross-sectional area of the accommodation space 172. The suction unit 173 does not completely fill the accommodation space 172 when the suction unit 173 is arranged in the accommodation space 172 of the frame body 177, and there is a gap space 174 between the suction unit 173 and the frame body 177, so that the suction unit 173 is displaceable relative to the frame body 177 and/or the bearing surface 151 in the accommodation space 172, for example, displaceable in a direction parallel to the bearing surface 151.

The fastener 175 does not completely fix the suction unit 173 and the frame body 177, so that the suction unit 173 is displaceable relative to the frame body 177. Specifically, the fastener 175 may include a head portion 1751 and a rod portion 1753, and a cross-sectional area of the head portion 1751 is greater than a cross-sectional area of the rod portion 1753. For example, the rod portion 1753 is a screw stem. The rod portion 1753 of the fastener 175 is configured to be connected to the fixing hole 1732 of the suction unit 173, and there is a small gap between the head portion 1751 of the fastener 175 and the frame body 177. In addition, the cross-sectional area of the rod portion 1753 of the fastener 175 may be less than a cross-sectional area of the perforation 1771 of the frame body 177, so that the rod portion 1753 of the fastener 175 may be relative to the frame body 177 in the perforation 1771.

A plurality of elastic units 1733, such as springs, may be arranged between the suction unit 173 and the frame body 177. The elastic units 1733 are located in the gap space 174.

As shown in FIG. 3, a plurality of alignment units 14 may be arranged on the bearing surface 151. The alignment units 14 are placed around the first substrate 121 and/or the second substrate 123 of the carrier 15, and may be close to or away from centers of the first substrate 121, the second substrate 123, and/or the bearing surface 151, to align the first substrate 121 and the second substrate 123. For example, the alignment unit 14 may be rod-shaped and retractable relative to the bearing surface 151. The alignment unit 14, after protruding from the bearing surface 151, may be displaced toward the first substrate 121 along a radial direction of the bearing surface 151. In a displacement process, the alignment unit 14 may touch and align the first substrate 121, to position the first substrate 121 at a fixed position of the bearing surface 151.

In a process of aligning the substrate, the alignment unit 14 may push the first substrate 121 to displace relative to the bearing surface 151 and drive, through the first substrate 121, the suction unit 173 to displace relative to the bearing surface 151 in the accommodation space 172 of the frame body 177, to compress and/or elongate the elastic unit 1733 located between the suction unit 173 and the frame body 177. Specifically, the first substrate 121 and the suction unit 173 are displaced along the direction parallel to the bearing surface 151.

When the suction unit 173 does not absorb the first substrate 121, for example, when bonding between the first substrate 121 and the second substrate 123 has finished, the elastic unit 1733 may restore an original length thereof, so that the suction unit 173 returns to a fixed position in the accommodation space 172.

As shown in FIG. 4, FIG. 5, and FIG. 6, the suction unit 173 includes at least one adsorption opening 1731 and air extraction pipe line 1735, and the air extraction pipe line 1735 is fluidly connected to the adsorption opening 1731. Specifically, at least one fluid channel may be arranged in the suction unit 173, and the air extraction pipe line 1735 is connected to the adsorption opening 1731 through the fluid channel.

The air extraction pipe line 1735 is configured to be connected to an air extraction apparatus, such as a motor. The air extraction apparatus, when being activated, forms a negative pressure above the adsorption opening 1731 of the suction unit 173 through the air extraction pipe line 1735 and absorbs the first substrate 121 placed on the bearing surface 151.

The accommodation space 172 of the frame body 177 has a first opening 1721 and a second opening 1723. The first opening 1721 is located on top of the frame body 177. When the frame body 177 is arranged in the setting groove 153 of the carrier 15, the first opening 1721 is located on the bearing surface 151. The air extraction pipe line 1735 may be connected to the air extraction apparatus through the second opening 1723. For example, the second opening 1723 is located at the bottom of the frame body 177, and the adsorption opening 1731 of the suction unit 173 is located in a direction of the first opening 1721 of the accommodation space 172.

The air extraction pipe line 1735 may be a flexible air extraction pipe line, and when the suction unit 173 is displaced relative to the frame body 177, the suction unit 173 may bend the air extraction pipe line 1735.

As shown in FIG. 3, a plurality of distance measurement units 18 may be arranged on the pressing unit 13, and the distance measurement units 18 may be, for example, laser range finders. The distance measurement units 18 are configured to project generated measurement beams onto the first substrate 121, to measure distances from distance measurement units 18 to the first substrate 121.

A warpage degree or a height of the first substrate 121 may be determined according to the distances measured by distance measurement units 18. Then, according to a measurement result, the suction unit driver 171 is controlled to adjust a lifting height of the suction unit 173 and/or the frame body 177, so that the suction unit 173 contacts and absorbs the first substrate 121.

The distance measurement units 18 may be arranged above the pressing unit 13, and a plurality of through-holes are provided on the pressing unit 13. The measurement beams generated by the distance measurement units 18 may be projected onto the first substrate 121 through the through-holes on the pressing unit 13. Positions of the distance measurement units 18 may correspond to movable suction modules 17, for example, facing the suction units 173 of movable suction modules 17.

Figure 7:
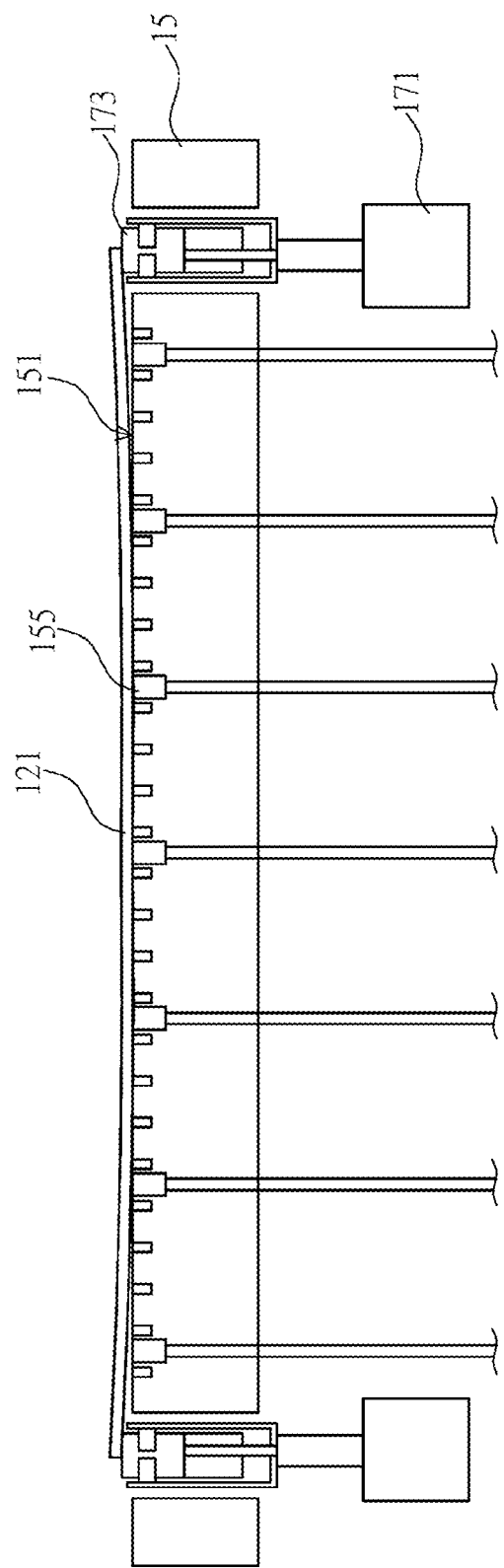
FIG. 7 is a schematic cross-sectional view of an embodiment in which a bonding machine with movable suction modules moves up to absorb a substrate according to this disclosure.
Figure 8:
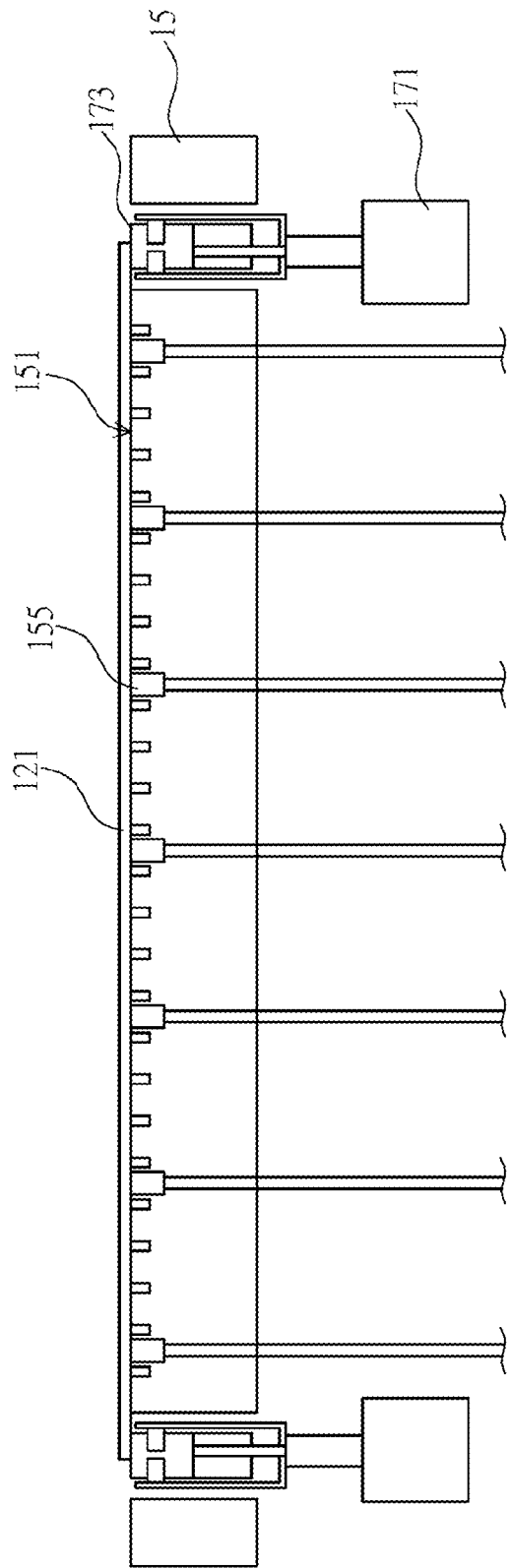
FIG. 8 is a schematic cross-sectional view of an embodiment in which a bonding machine with movable suction modules absorbs and flattens a substrate according to this disclosure.

As shown in FIG. 7, the suction unit driver 171 may drive the suction unit 173 to move up, so that the suction unit 173 protrudes from the bearing surface 151 and absorbs the first substrate 121 with upward warpage. As shown in FIG. 8, the suction unit driver 171 drives the suction unit 173 to move down. For example, a height of the suction unit 173 approximates a height of the bearing surface 151. The suction unit 173, when moving down, pulls the absorbed first substrate 121 and flattens the first substrate 121 with the upward warpage.

A plurality of air extraction openings 155 may be provided on the bearing surface 151. The air extraction opening 155 is fluidly connected to the air extraction apparatus, and when the air extraction apparatus extracts air, a negative pressure is formed in the air extraction opening 155, to absorb the first substrate 121 placed on the bearing surface 151. Specifically, the air extraction opening 155 arranged on the bearing surface 151 may be located at an inner side of the movable suction module 17 for absorbing an inner side of the first substrate 121, and the movable suction module 17 is configured to absorb an outer side of the first substrate 121 to improve flatness of the first substrate 121. In addition, when the first substrate 121 is aligned through the alignment unit 14, the air extraction opening 155 on the bearing surface 151 stops generating the negative pressure, so that the alignment unit 14 can push the first substrate 121 and the suction unit 173 to displace relative to the bearing surface 151.

In the drawings of this disclosure, the movable suction module 17 may be arranged at the outer side of the first substrate 121 and/or an outer side of the bearing surface 151. In practical applications, the movable suction module 17 may also be arranged at the inner side of the first substrate 121 and/or an inner side of the bearing surface 151. For example, some or all of the air extraction openings 155 in FIG. 3, FIG. 7, and FIG. 8 may be the movable suction modules 17.

Specifically, in the process of aligning the first substrate 121 by the alignment unit 14 of this disclosure, the suction unit 173 continuously absorbs and flattens the first substrate 121, which can effectively improve accuracy of the alignment unit 14 in aligning the first substrate 121.

Figure 9:
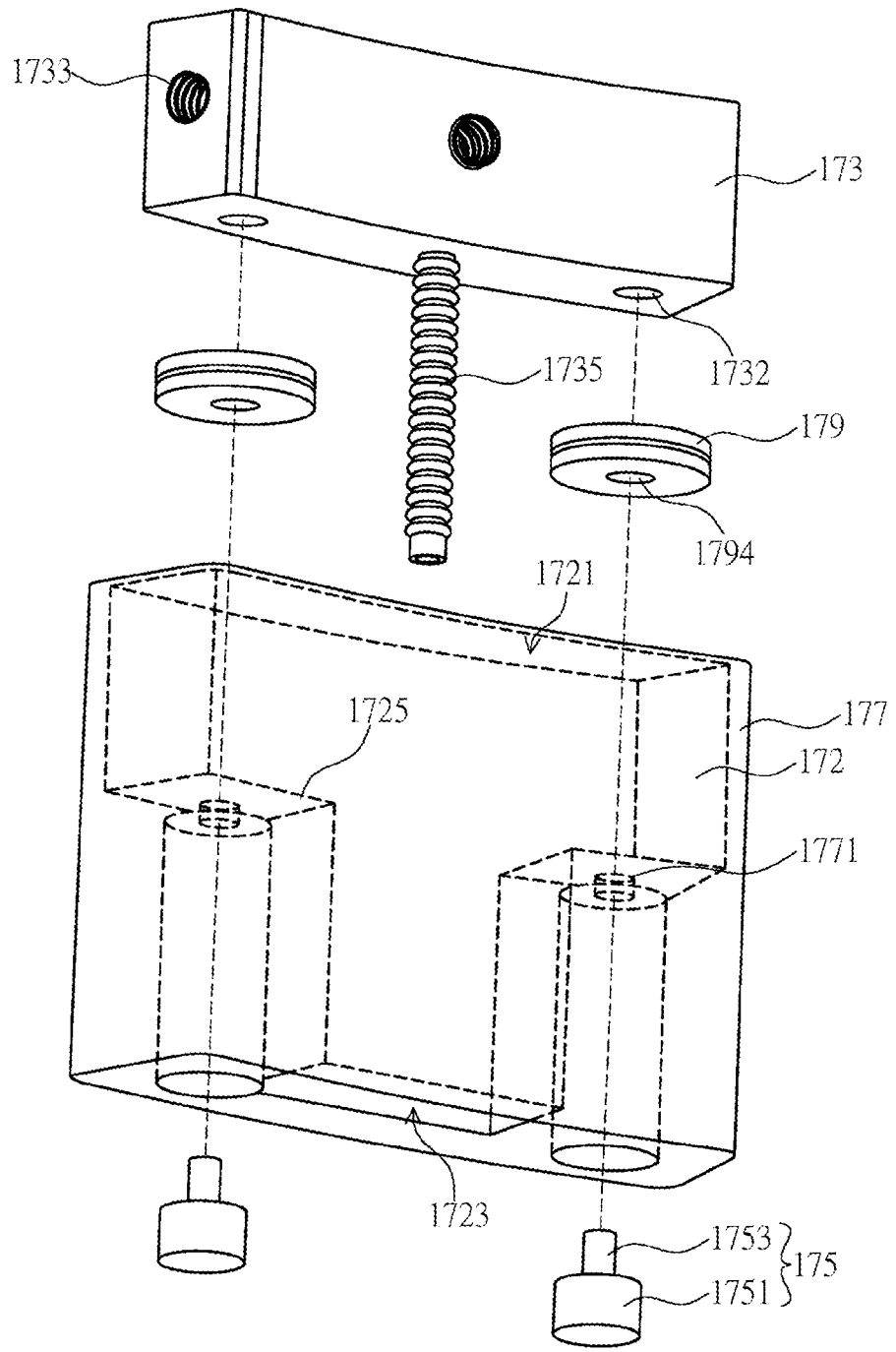
FIG. 9 is a schematic three-dimensional exploded view of still another embodiment of an suction unit and a frame body of a bonding machine with movable suction modules according to this disclosure.
Figure 10:
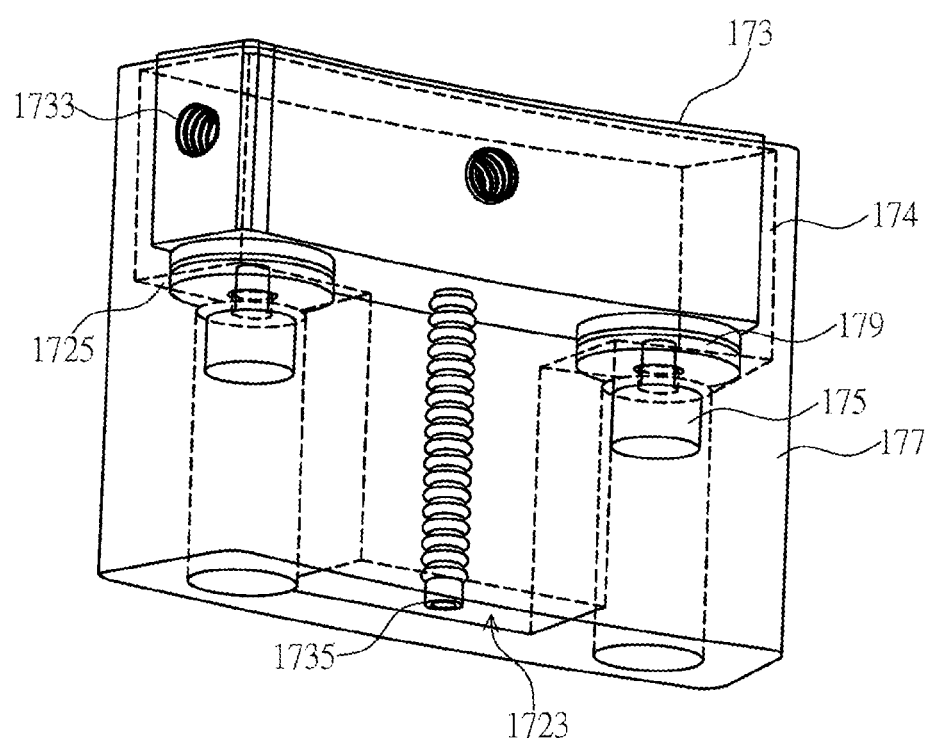
FIG. 10 is a three-dimensional perspective view of still another embodiment of an suction unit and a frame body of a bonding machine with movable suction modules according to this disclosure.

In another embodiment of this disclosure, as shown in FIG. 9 and FIG. 10, the movable suction module 17 includes the suction unit driver 171, the suction unit 173, the frame body 177, and a rolling module 179. The rolling module 179 is located between the frame body 177 and the suction unit 173, to facilitate the suction unit 173 to displace relative to the frame body 177 in the accommodation space 172. The accommodation space 172 of the frame body 177 includes at least one connection bottom surface 1725, and the rolling module 179 is arranged on the connection bottom surface 1725. The suction unit 173 is placed in the accommodation space 172 of the frame body 177 and enables the connection bottom surface 1725 of the frame body 177 to connect to and absorb the suction unit 173 through the rolling module 179.

Figure 11:
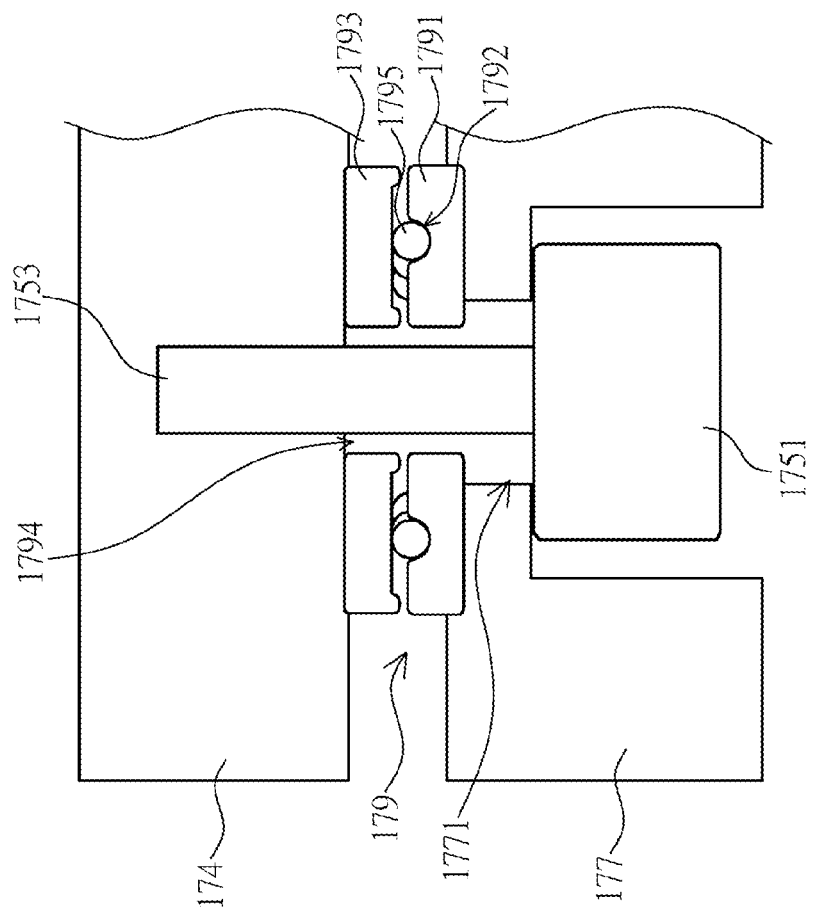
FIG. 11 is a schematic cross-sectional view of an embodiment of an suction unit, a frame body, and a rolling module of a bonding machine with movable suction modules according to this disclosure.
Figure 12:
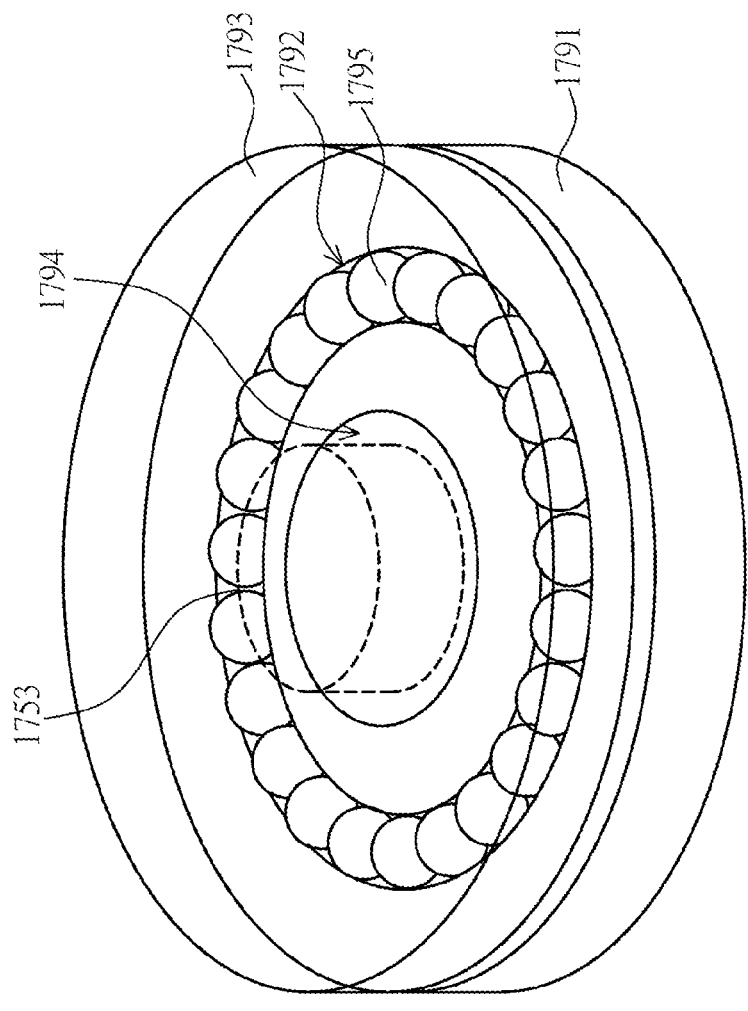
FIG. 12 is a three-dimensional perspective view of an embodiment of a rolling module of a bonding machine with movable suction modules according to this disclosure.

As shown in FIG. 11 and FIG. 12, the rolling module 179 includes a base 1791, a connection base 1793, and at least one ball 1795. The ball 1795 is located between the base 1791 and the connection base 1793, so that there is a gap between the base 1791 and the connection base 1793, thereby preventing the connection base 1793 from directly touching the base 1791. The connection base 1793 is displaceable relative to the base 1791 and can drive the ball 1795 therebetween to roll.

The base 1791 of the rolling module 179 is connected to the frame body 177, and the connection base 1793 is connected to the suction unit 173. In addition, a groove 1792 may be provided on a surface of the base 1791 facing the connection base 1793, and the ball 1795 is placed in the groove 1792, so that the ball 1795 rolls in the groove 1792. The rolling module 179 can reduce a friction force generated when the suction unit 173 is displaced relative to the frame body 177, and can also avoid generating particles in the displacement process.

In another embodiment of this disclosure, the foregoing rolling module 179 may also be replaced with a deformation unit, which is located between the suction unit 173 and the frame body 177. For example, the deformation unit may be a spring or an elastic washer. Specifically, the deformation unit may be arranged on the connection bottom surface 1725 of the frame body 177, so that the connection bottom surface 1725 of the frame body 177 is carried by the deformation unit and is connected to the suction unit 173. When the suction unit 173 is displaced relative to the frame body 177, the deformation unit is deformed. The deformation unit can also avoid the direct contact between the suction unit 173 and the frame body 177, and avoid generating friction when suction unit 173 is displaced relative to the frame body 177.

The base 1791 and the connection base 1793 may be annular, and connection holes 1794 are provided on the base 1791 and the connection base 1793. The groove 1792 provided on the base 1791 may be an annular groove, and a plurality of balls 1795 may be arranged in the annular groove. The connection hole 1794 of the rolling module 179 may be aligned with the fixing hole 1732 of the suction unit 173 and the perforation 1771 of the frame body 177, and the rod portion 1753 of the fastener 175 may pass through the perforation of the frame body 177 and the connection hole 1794 of the rolling module 179, and be fixed on the fixing hole 1732 of the suction unit 173. The cross-sectional area of the rod portion 1753 of the fastener 175 is less than a cross-sectional area of the connection hole 1794.

The foregoing descriptions are merely preferred embodiments of this disclosure, and are not intended to limit the scope of this disclosure, that is, all equivalent changes and modifications made according to shapes, structures, features and spirits described in the scope of the claims of this disclosure shall fall within the scope of the claims of this disclosure.

What is claimed is:

1. A bonding machine with movable suction modules, comprising:
   a first cavity;
   a second cavity facing the first cavity, wherein the first cavity is configured to be connected to the second cavity to form a closed space between the first cavity and the second cavity;
   a pressing unit connected to the first cavity and located in the closed space;
   a carrier connected to the second cavity and located in the closed space, wherein the carrier comprises a bearing surface facing the pressing unit, the bearing surface is configured to bear a first substrate, and a second substrate is placed on the first substrate, wherein a plurality of setting grooves are provided on the bearing surface of the carrier; and
   a plurality of movable suction modules, comprising:
      a plurality of suction units arranged in the plurality of the setting grooves of the bearing surface and being displaceable relative to the bearing surface of the carrier, wherein the suction units are configured to absorb the first substrate placed on the bearing surface of the carrier; and
      a plurality of suction unit drivers connected to the plurality of the suction units and configured to drive the suction units to move up and down relative to the bearing surface of the carrier, so that the suction units flatten the absorbed first substrate.

2. The bonding machine with movable suction modules according to claim 1, comprising a plurality of distance measurement units arranged on the pressing unit and configured to measure distances from the plurality of the distance measurement units to the first substrate placed on the bearing surface of the carrier.

3. The bonding machine with movable suction modules according to claim 2, wherein the suction unit driver is configured to adjust a lifting height of the suction unit according to a measurement result from the distance measurement unit, so that the suction unit absorbs the first substrate.

4. The bonding machine with movable suction modules according to claim 1, wherein the movable suction module comprises a frame body, the frame body comprises an accommodation space configured to accommodate the suction unit, and the suction unit driver is connected to the frame body and drives, through the frame body, the suction unit to move up and down relative to the bearing surface of the carrier.

5. The bonding machine with movable suction modules according to claim 4, wherein the suction unit comprises an adsorption opening and an air extraction pipe line, and the air extraction pipe line is fluidly connected to the adsorption opening to form a negative pressure above the adsorption opening, so that the adsorption opening absorbs the first substrate placed on the bearing surface.

6. The bonding machine with movable suction modules according to claim 5, wherein a cross-sectional area of the accommodation space of the frame body is greater than a cross-sectional area of the suction unit, so that the suction unit is displaceable relative to the bearing surface of the carrier in the accommodation space.

7. The bonding machine with movable suction modules according to claim 6, wherein the frame body comprises at least one perforation, and a fastener passes through the perforation of the frame body to connect to the suction unit.

8. The bonding machine with movable suction modules according to claim 7, wherein the fastener comprises a head portion and a rod portion, and a cross-sectional area of the perforation is greater than a cross-sectional area of the rod portion of the fastener and less than a cross-sectional area of the head portion of the fastener.

9. The bonding machine with movable suction modules according to claim 7, wherein the accommodation space comprises at least one connection bottom surface, the perforation is located on the connection bottom surface, and the fastener passes through the perforation on the connection bottom surface to connect to the suction unit.

10. The bonding machine with movable suction modules according to claim 7, wherein the accommodation space of the frame body comprises a first opening and a second opening, and when the frame body is arranged in the setting groove of the carrier, the first opening is located on the bearing surface of the carrier and the air extraction pipe line is connected to an air extraction apparatus through the second opening.

11. The bonding machine with movable suction modules according to claim 10 wherein the adsorption opening of the suction unit is located in a direction of the first opening of the accommodation space.

12. The bonding machine with movable suction modules according to claim 4, comprising a plurality of elastic units located between the frame body and the suction unit.

13. The bonding machine with movable suction modules according to claim 4, comprising a plurality of alignment units located on the bearing surface of the carrier and configured to align the first substrate and the second substrate, wherein in a process of aligning the first substrate, the alignment unit drives, through the first substrate, the suction unit to displace relative to the bearing surface of the carrier in the accommodation space of the frame body.

14. The bonding machine with movable suction modules according to claim 4, comprising a rolling module located between the frame body and the suction unit, so that the suction unit is displaceable relative to the frame body.

15. The bonding machine with movable suction modules according to claim 14, wherein the accommodation space of the frame body comprises at least one connection bottom surface, at least one perforation is provided on the connection bottom surface, the rolling module is arranged on the connection bottom surface, and a fastener passes through the perforation on the connection bottom surface to connect to the suction unit, wherein a cross-sectional area of the perforation is greater than a cross-sectional area of a rod portion of the fastener.

16. The bonding machine with movable suction modules according to claim 15, wherein the rolling module comprises a base, a plurality of balls, and a connection base, the base is connected to the frame body, the connection base is connected to the suction unit, and the plurality of the balls are located between the base and the connection base.

17. The bonding machine with movable suction modules according to claim 1, comprising a plurality of air extraction openings provided on the bearing surface of the carrier and located at inner sides of the plurality of the movable suction modules, wherein the movable suction modules are configured to absorb an outer side of the first substrate, and the plurality of air extraction openings are configured to absorb an inner side of the first substrate.

18. The bonding machine with movable suction modules according to claim 1, comprising a cavity driver located outside the closed space and connected to the first cavity, wherein the cavity driver is configured to drive the first cavity to displace relative to the second cavity.

19. The bonding machine with movable suction modules according to claim 18, comprising a pressing unit driver located outside the closed space and connected to the pressing unit, wherein the pressing unit driver is configured to drive the pressing unit to approach or move away from the carrier.

20. The bonding machine with movable suction modules according to claim 1, comprising an air extraction motor connected to the first cavity or the second cavity and fluidly connected to the closed space to extract air inside the closed space.

* * * * *